(12) United States Patent
Julien

(10) Patent No.: US 10,777,552 B2
(45) Date of Patent: Sep. 15, 2020

(54) METHOD OF SIMULTANEOUS FABRICATION OF SOI TRANSISTORS AND OF TRANSISTORS ON BULK SUBSTRATE

(71) Applicant: STMICROELECTRONICS (ROUSSET) SAS, Rousset (FR)

(72) Inventor: Franck Julien, La Penne sur Huveaune (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/046,683

(22) Filed: Jul. 26, 2018

(65) Prior Publication Data

US 2019/0035784 A1 Jan. 31, 2019

(30) Foreign Application Priority Data

Jul. 27, 2017 (FR) ...................................... 17 57144

(51) Int. Cl.
| | | |
|---|---|---|
| H01L 29/00 | (2006.01) | |
| H01L 27/088 | (2006.01) | |
| H01L 21/8236 | (2006.01) | |
| H01L 21/84 | (2006.01) | |
| H01L 27/12 | (2006.01) | |
| H01L 29/423 | (2006.01) | |

(52) U.S. Cl.
CPC ...... *H01L 27/0883* (2013.01); *H01L 21/8236* (2013.01); *H01L 21/84* (2013.01); *H01L 27/1207* (2013.01); *H01L 29/42368* (2013.01)

(58) Field of Classification Search
None
See application file for complete search history.

(56) References Cited

U.S. PATENT DOCUMENTS

| | | |
|---|---|---|
| 6,097,069 A | 8/2000 | Brown et al. |
| 2006/0216903 A1 | 9/2006 | Tigelaar |
| 2009/0096036 A1* | 4/2009 | Ishigaki .......... H01L 21/823418 257/392 |
| 2011/0260233 A1 | 10/2011 | Nguyen et al. |
| 2013/0087855 A1 | 4/2013 | Makiyama et al. |

FOREIGN PATENT DOCUMENTS

JP H0964367 A 3/1997

* cited by examiner

*Primary Examiner* — Reema Patel
(74) *Attorney, Agent, or Firm* — Seed Intellectual Property Law Group LLP

(57) ABSTRACT

The disclosure relates to a method of simultaneous fabrication of an MOS transistor of SOI type, and of first and second transistors on bulk substrate, comprising: a) providing a semiconductor layer on an insulating layer covering a semiconductor substrate; b) forming a mask comprising, above the location of the second transistor, a central opening which is less wide than the second transistor to be formed; c) plumb with the opening, entirely etching the semiconductor layer and insulating layer, hence resulting in remaining portions of the insulating layer at the location of the second transistor; d) growing the semiconductor by epitaxy as far as the upper level of the semiconductor layer; e) forming isolating trenches; and f) forming the gate insulators of the transistors, the gate insulator of the second transistor comprising at least one part of the said remaining portions of the insulating layer.

20 Claims, 4 Drawing Sheets

METHOD OF SIMULTANEOUS FABRICATION OF SOI TRANSISTORS AND OF TRANSISTORS ON BULK SUBSTRATE

BACKGROUND

Technical Field

The present patent application relates to the field of electronic chips, and in particular to a method of simultaneous fabrication in one and the same chip of transistors of silicon on insulator (SOI) type and of N-channel and P-channel transistors of on-bulk-substrate type.

Description of the Related Art

An electronic chip may contain, on a semiconductor substrate, at one and the same time transistors of semiconductor on insulator (SOI) type and transistors of on-bulk-substrate type. In a transistor of SOI type, the channel region is situated in the upper semiconductor layer of a so-called SOI structure comprising, under the upper layer, an insulator covering a substrate. The SOI transistors may be of fully depleted silicon on insulator (FDSOI) type, that is to say having their channel region made of intrinsic semiconductor which is less than 25 nm, or indeed than 10 nm, in thickness. In a transistor of on-bulk-substrate type, the channel region is a doped upper part of the substrate.

The diverse transistor types allow different ways of operating, in digital or analogue mode, at various voltages. Transistors on bulk substrate are often preferred in analogue mode and/or for high voltages, for example greater than 3 V.

Transistors on bulk substrate may exhibit diverse problems, more particularly when dealing with N-channel transistors.

One problem is that, in such transistors in general, the smaller the transistors, the higher, in relative value, the leakage current. This results in high energy consumption.

Another problem is that transistors intended to be identical in fact generally exhibit different electrical characteristics, in particular different threshold voltages. The differences between these electrical characteristics usually tend to get worse as the operating temperature decreases. This results in diverse difficulties in actually obtaining the envisaged electrical characteristics. These difficulties arise particularly in respect of analogue operation, for example in a measurement device, and/or in respect of cold operation, for example at negative ambient temperature. This usually leads to certain chips being rejected during post-fabrication checking.

Diverse solutions make it possible to solve the problems mentioned hereinabove. The known methods making it possible to implement these solutions for N-channel transistors on bulk substrate and simultaneously to fabricate P-channel transistors on bulk substrate and SOI transistors pose diverse problems. In particular, these methods require numerous fabrication steps.

BRIEF SUMMARY

One embodiment makes provision to alleviate all or some of the drawbacks described hereinabove.

Thus, one embodiment provides a method of simultaneous fabrication of an MOS transistor of SOI type, of a first transistor on bulk substrate and of a second transistor on bulk substrate, comprising: a) providing a semiconductor layer on an insulating layer covering a semiconductor substrate; b) forming a masking layer covering the location of the transistor of SOI type and comprising, above the location of the first transistor, an opening which is wider than the first transistor to be formed, and, above the location of the second transistor, a central opening which is less wide than the second transistor to be formed; c) plumb with the openings, etching cavities passing entirely through the semiconductor layer and insulating layer, hence resulting in remaining portions of the insulating layer under the edges of the location of the second transistor; d) growing the semiconductor by epitaxy in the cavities as far as the upper level of the semiconductor layer; e) forming isolating trenches delimiting the transistors to be formed, and removing the elements of the structure that are situated above the upper level of the semiconductor layer; and f) forming the gate insulators of the transistors, the gate insulator of the second transistor comprising at least one part of the said remaining portions of the insulating layer and being thicker at the edges than at the centre of the second transistor.

According to one embodiment, the method comprises in step f): undertaking a thermal oxidation of the portions of the semiconductor layer that are situated on the said remaining portions of the insulating layer.

According to one embodiment, the method comprises in step f): removing at least one upper part of the portions of the semiconductor layer that are situated on the said remaining portions of the insulating layer.

According to one embodiment, in step f), the gate insulator of the second transistor is formed at least in part by deposition.

According to one embodiment, the method comprises: between step a) and step b), covering the structure with a silicon nitride layer; in step c), etching the silicon nitride layer plumb with the openings; and between step c) and step d), removing the masking layer.

According to one embodiment, the method comprises in step a): covering the semiconductor layer with a silicon oxide layer.

According to one embodiment, in step b), the opening situated above the second transistor has a rectangular shape viewed from above and extends above the drain-source regions of the second transistor to be formed.

According to one embodiment, in step b), the opening situated above the location of the second transistor comprises, viewed from above, a central part which is less wide than the second transistor to be formed, and two portions which are situated above the drain-source regions of the second transistor to be formed and are wider than the second transistor to be formed.

According to one embodiment, the said remaining portions of the insulating layer have a width of between 2 and 50 nm.

According to one embodiment, the semiconductor layer has a thickness of between 5 and 500 nm.

According to one embodiment, the insulating layer has a thickness of between 5 and 500 nm.

According to one embodiment, the first transistor on bulk substrate is P-channel and the second transistor on bulk substrate is N-channel.

One embodiment provides an electronic chip comprising an MOS transistor of SOT type, a first transistor on bulk substrate and a second transistor on bulk substrate, in which the edges of the gate insulator of the second transistor comprise portions of the insulating layer of the SOT structure in and on which the transistor of SOT type is formed, the gate insulator of the second transistor being thicker at the edges than at the centre of the second transistor, and the gate insulator of the first transistor being devoid of portions of the insulating layer of the said SOT structure.

According to one embodiment, the first transistor on bulk substrate is P-channel and the second transistor on bulk substrate is N-channel.

BRIEF DESCRIPTION OF THE SEVERAL VIEWS OF THE DRAWINGS

These characteristics and advantages, as well as others, will be set forth in detail in the following non-limiting description of particular embodiments given in conjunction with the attached figures among which.

DETAILED DESCRIPTION

Like elements have been designated by like references in the various figures and, moreover, the diverse figures are not drawn to scale. For the sake of clarity, only the elements useful to the understanding of the embodiments described have been represented and are detailed.

In the description which follows, when reference is made to qualifiers of absolute position, such as the terms "top", "bottom", "left", "right", etc., or relative position, such as the terms "above", "below", "upper", "lower", etc., reference is made to the orientation of the element concerned in the sectional views.

FIGS. 1A to 1E are partial and schematic sectional views illustrating steps of a method of fabrication, on the left side, of a transistor of SOI type and, on the right side, of a transistor of on-bulk-substrate type. FIG. 1F is a view from above of the structure of FIG. 1E.

Figure 1A:
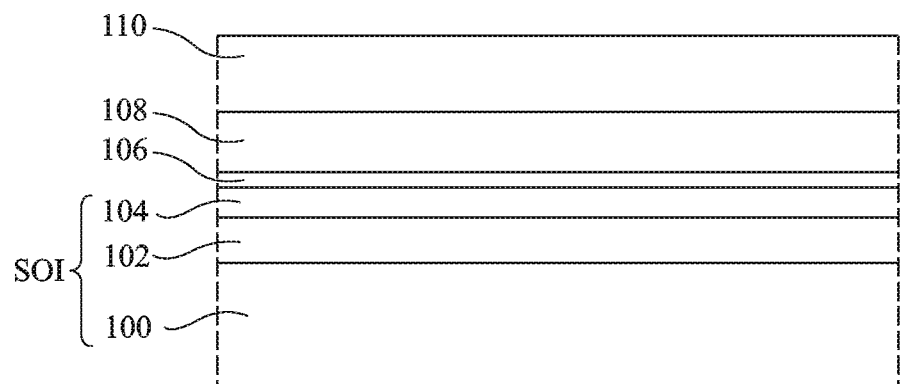
FIGS. 1A to 1E are partial and schematic sectional views illustrating steps of a method of fabrication of a transistor of SOT type and a transistor of on-bulk-substrate type.

In the step of FIG. 1A, an SOI structure has been provided, comprising, on a semiconductor substrate 100, of for example silicon, an insulating layer 102 covered with a semiconductor upper layer 104, of for example silicon. A silicon oxide protection layer 106 and masking layers of silicon nitride 108 and of photosensitive resin 110 are formed successively on the structure.

Figure 1B:
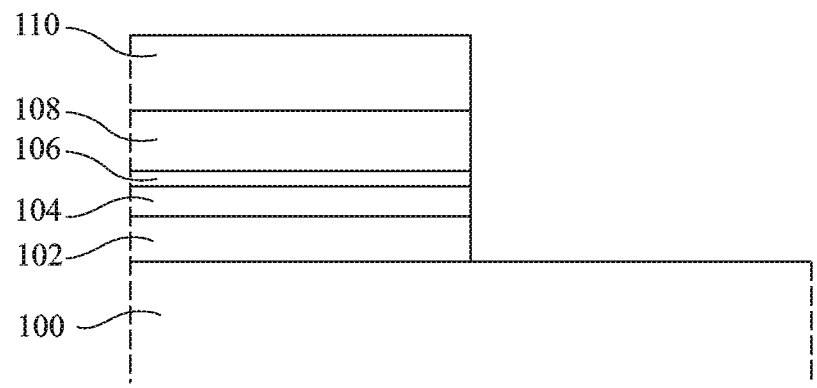

In the step of FIG. 1B, the right side of the resin masking layer 110 has been removed, for example by photolithography. Thereafter, the nitride layer 108, the oxide layer 106, the semiconductor layer 104 and the insulating layer 102 are etched, on the right side alone, over their entire thickness, at least as far as the substrate 100. By way of example, firstly the layers 108, 106 and 104 are etched as far as the layer 102 which serves as etching barrier, and then the layer 102, of for example silicon oxide, is etched with a hydrofluoric acid solution.

Figure 1C:
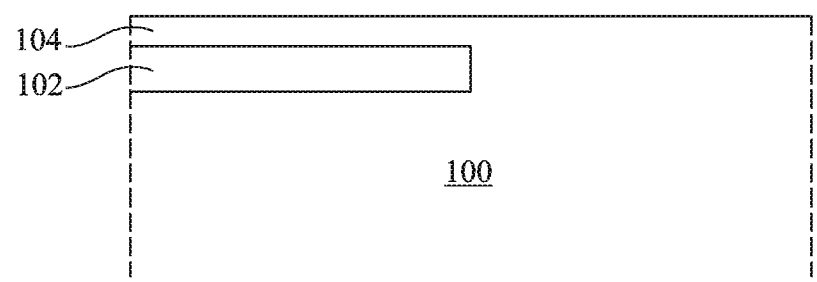

In the step of FIG. 1C, the masking layer 110 has been removed, and then silicon is grown, on the right side, by epitaxy from the surface of the substrate 100, until reaching the upper level of the layer 104. The nitride layer 108 makes it possible to mask the left side of the structure. This layer 108 has thereafter been removed, as has the oxide layer 106. In the structure obtained, the SOI structure has remained intact on the left side, and, on the right side, the substrate 100 is bulk and reaches the upper level of the semiconductor layer 104.

Figure 1D:
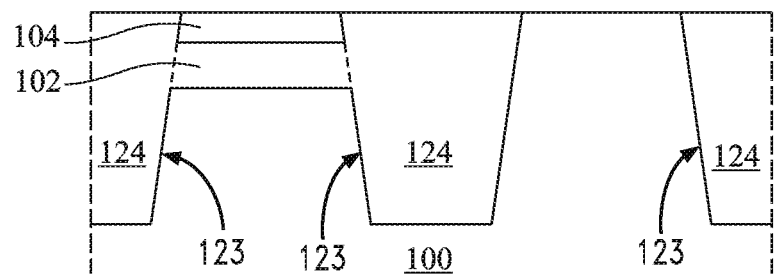

In the step of FIG. 1D, trenches 123 have been etched, penetrating into the substrate. The trenches delimit the future transistors.

The trenches have been filled with an insulator, for example silicon oxide, to form trench isolators 124 that extend as far as the upper level common to the semiconductor layer 104 on the left side and to the substrate 100 on the right side. Accordingly, by way of example, it is possible to deposit silicon oxide on the structure as far as a level situated above the layer 104, and thereafter to undertake a mechano-chemical polishing (MCP) as far as an etching barrier layer, not represented, for example of silicon nitride, deposited on the structure before etching of the trenches and removed after polishing.

Figure 1E:
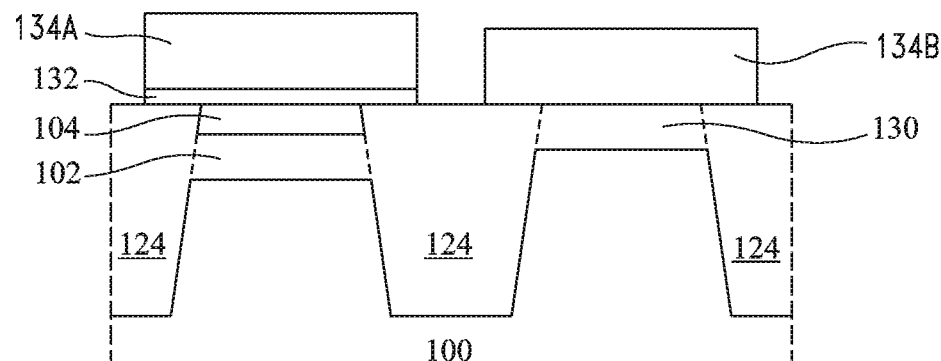
Figure 1F:
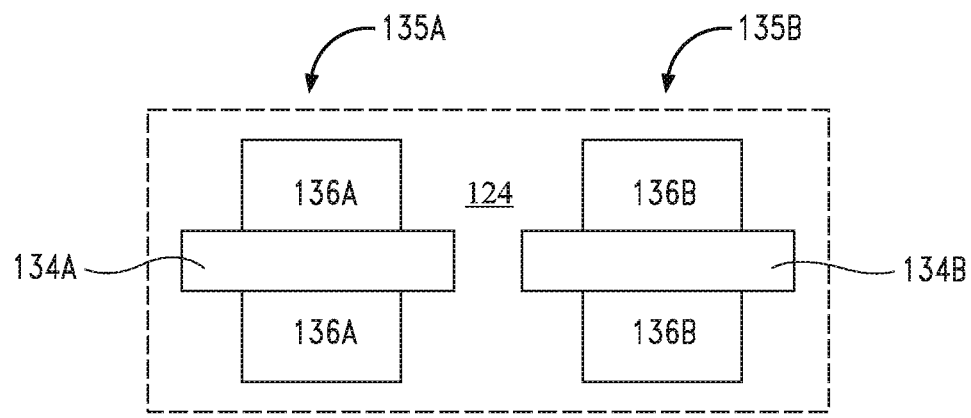
FIG. 1F is a schematic view from above of the structure of FIG. 1E.

In the step of FIG. 1E, a thermal oxidation has been undertaken of the upper parts of the substrate 100 which are exposed on the surface of the structure, for example exclusively on the right side by protecting the layer 104 on the left side by a mask, not represented. This produces an insulator layer 130 which forms the gate insulator of the bulk substrate transistor. On the left side, the structure has been covered with an insulator layer 132 which forms the gate insulator of the SOI transistor. The transistors, whose gates 134A, 134B are visible in FIG. 1E, will be completed thereafter. In the example represented, the bulk substrate transistor is a P-channel transistor, as is the SOI transistor. The thickness of the gate insulator 130 is typically from 5 to 30 nm. The gate insulator 132 can be of a different nature and/or thickness to those of the gate insulator 130.

FIG. 1F shows the completed SOI transistor 135A and bulk substrate transistor 135B. In FIG. 1F, in each transistor viewed from above, the gate 134A, 134B extends over the entire width of the respective transistor 135A, 135B. Drain and source regions 136A of the SOI transistor 135A have been formed in the semiconductor layer 104 next to opposite sides of the gate 134A. Similarly, drain and source regions 136B of the bulk substrate transistor 135B have been formed in the epitaxial portion of the bulk substrate 100 next to opposite sides of the gate 134B.

A method making it possible to simultaneously obtain the SOI transistor 135A and the bulk substrate transistor 135B has been described hereinabove. However this method is not suitable for obtaining an N-channel transistor on bulk substrate of optimal electrical characteristics. Indeed, in the N-channel transistor, the channel region is P-type doped. However, the dopant atoms of type P tend to migrate into the insulator of the trenches in the course of diverse annealings provided for in the method, notably when dealing with boron atoms and trenches filled with silicon oxide. It follows from this that the level of doping of the channel region is lower at the edges of the transistor than at the centre of the transistor, and is so in an irregular manner. This results in diverse edge effects which are the cause of problems, set forth in the preamble, of leakage current and of differences between transistors intended to be identical.

FIGS. 2A to 2D are partial and schematic sectional views illustrating steps of an embodiment of a method of simultaneous fabrication of a transistor of SOI type and of N-channel and P-channel transistors of on-bulk-substrate type. Represented are, on the left side, the location 200 of the future SOI transistor 235S, at the centre, the location 202P of the future P-channel transistor 235P on bulk substrate, and, on the right side, the location 202N of the future N-channel transistor 235N on bulk substrate. FIG. 2E is a view from above of the structure of FIG. 2D.

Figure 2A:
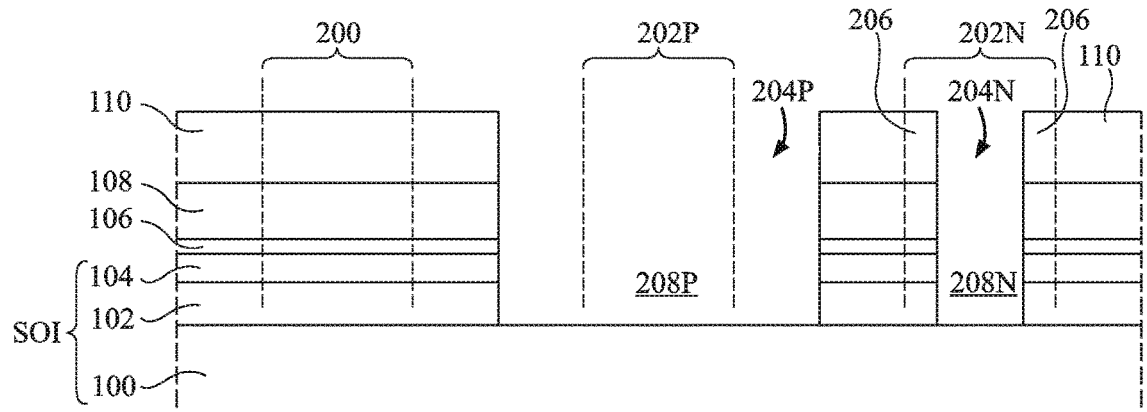
FIGS. 2A to 2D are partial and schematic sectional views illustrating steps of an embodiment of a method of simultaneous fabrication of a transistor of SOT type and of N-channel and P-channel transistors of on-bulk-substrate type.

In the step of FIG. 2A, a structure similar to that illustrated in FIG. 1B has been provided, which includes the semiconductor substrate 100, the insulating layer 102 covered with the semiconductor upper layer 104, the silicon oxide protection layer 106, and the masking layers of silicon nitride 108 and of photosensitive resin 110.

An opening 204P above the location 202P of the future P-channel transistor, and an opening 204N above the location 202N of the future N-channel transistor have been etched in the layer 110. The opening 204P is wider than the future P-channel transistor 235P. The opening 204N, situated plumb with a central part of the future N-channel transistor 235N, is less wide than this future transistor. Therefore, the edges of the future N-channel transistor are situated under portions 206 of the masking layer 110.

Figure 2B:
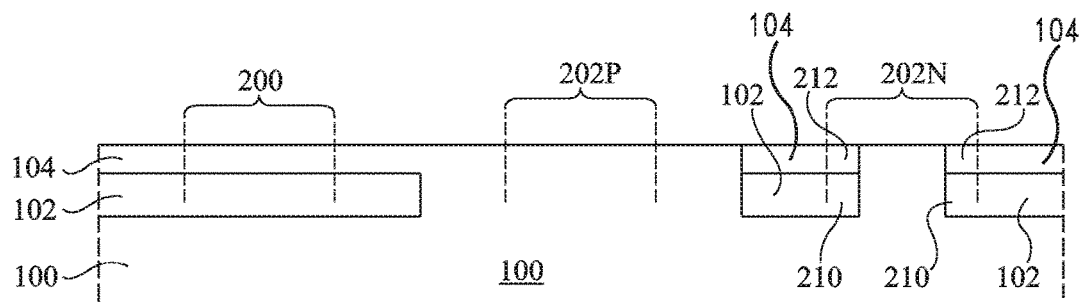

Thereafter, as shown in FIG. 2B, the parts of the layers of silicon nitride 108 and of silicon oxide 106, of the upper semiconductor layer 104 and of the insulating layer 102 that are situated under the openings 204P and 204N have been etched over the entire thickness of the layers, at least as far as the upper surface of the substrate 100. This results in a cavity 208P at the location 202P of the P-channel transistor 235P and a central cavity 208N at the location 202N of the N-channel transistor 235N. At the edges of the location 202N, portions 210 of the insulating layer 102 have remained in place. The insulating portions 210 are situated under portions 212 of the semiconductor layer 104.

The step of FIG. 2B is similar to that of FIG. 1C. The masking layer 110 has been removed, and then silicon has been grown on the parts of the substrate 100 that are accessible through the openings as far as the upper level of the layer 104. After this, at the level of the openings, the substrate 100 reaches the upper level of the layer 104. Thereafter, all the elements of the structure that are situated above the level of the layer 104, namely the layers 108, 106 and 104, have been removed. An optional mechano-chemical polishing step can be provided for so as to obtain a smooth surface.

Figure 2C:
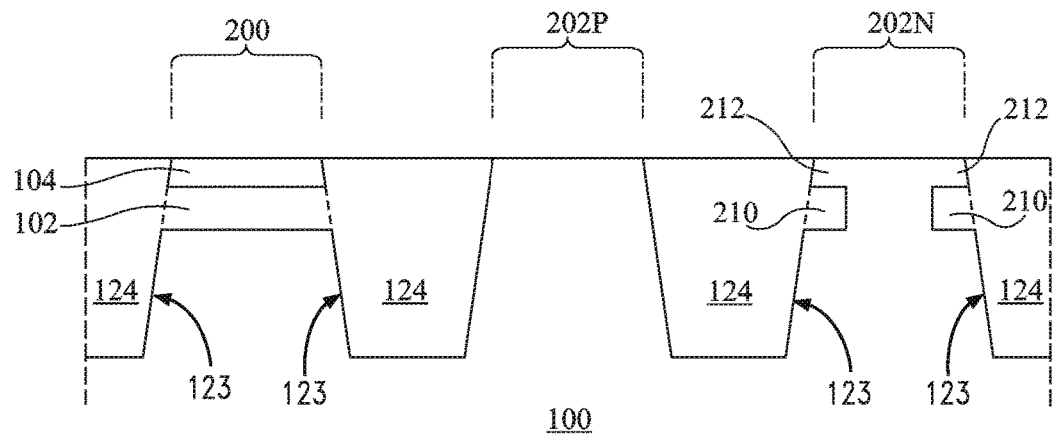

In the step of FIG. 2C, trenches 123 have been etched, passing through the layers 104 and 102 and penetrating into the substrate 100. The trenches delimit the future transistors. The trenches 123 have been filled with insulator, for example with silicon oxide, to form trench isolators 124 as far as the upper level of the semiconductor layer 104 and semiconductor substrate 200.

Figure 2D:
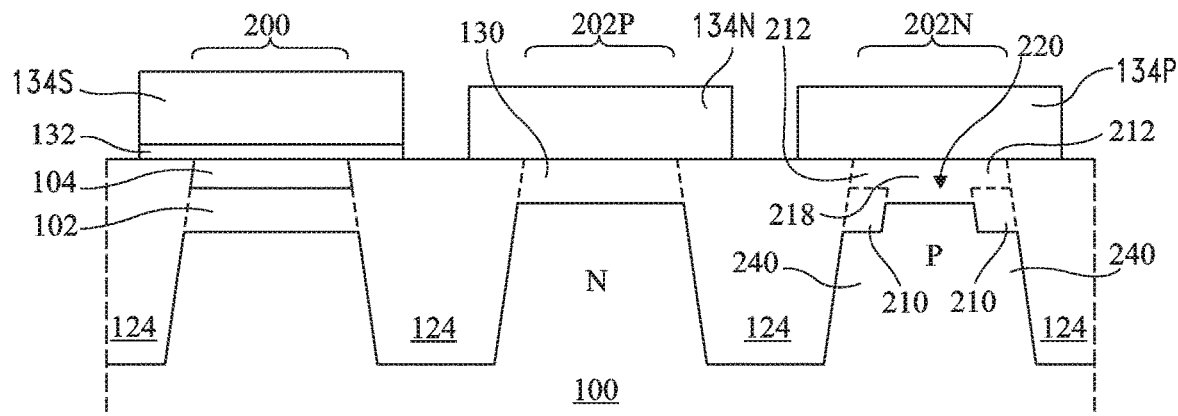
Figure 2E:
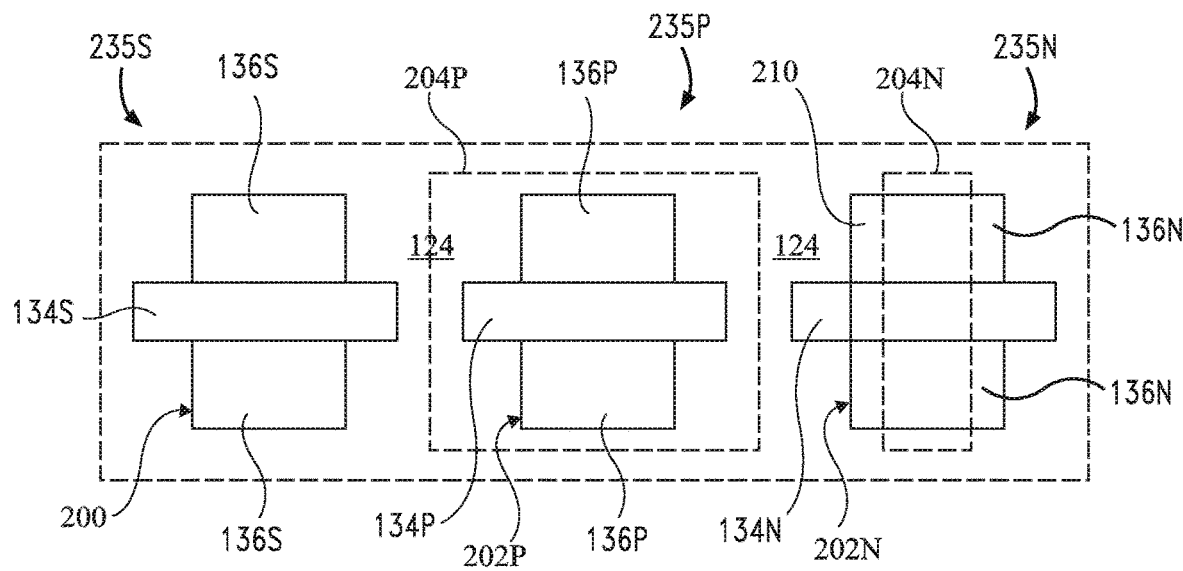
FIG. 2E is a schematic view from above of the structure of FIG. 2D.

In the step of FIG. 2D, a thermal oxidation has been undertaken of the upper parts of the substrate which are exposed on the surface of the structure, for example exclusively at the locations of the transistors 235P, 235N on bulk substrate by protecting the layer 104 at the location of the SOI transistor 235S by a mask, not represented, as far as a level situated between the top and the bottom of the portions 210 of the insulating layer 102. The portions 212 of the semiconductor layer 104 and a part 218 of the substrate 100 between the portions 212 have therefore been oxidized at the location 202N of the N-channel transistor 235N to form the gate insulator 220 of the N-channel transistor. At the same time, the thermal oxidation forms an insulating layer 130 that forms the gate insulator of the P-channel transistor 235P. At the location 200 of the SOI transistor 235S, the structure has been covered with an insulator layer 132 that forms the gate insulator of the SOI transistor 235S. The method forms respective gates 134S, 134P, 134N on the respective gate insulators 132, 130, 220 of the transistors 235S, 235P, 235N, respectively, as shown in FIG. 2D.

The gate insulator 220 of the N-channel transistor is formed of the oxidized part 218 and of the insulating portions 210. Thus, the gate insulator 220 is thicker at the edges of the N-channel transistor than at the centre of the N-channel transistor.

FIG. 2E shows the completed SOI transistor 235S, and P-channel bulk substrate transistor 235P, and N-channel bulk substrate transistor 235N. Drain and source regions 136S of the SOI transistor 235S have been formed in the semiconductor layer 104 next to opposite sides of the gate 134S. Similarly, drain and source regions 136P of the bulk substrate P-channel transistor 235P have been formed in the epitaxial portion of the bulk substrate 100 in the location 202P, and drain and source regions 136N of the bulk substrate N-channel transistor 235N have been formed in the epitaxial portion of the bulk substrate 100 in the location 202N.

In FIG. 2E, in each transistor viewed from above, the gate extends over the entire width of the transistor. Drain and source regions have been formed on each side of the gate in the corresponding location 200, 202N or 202P. By way of example, a single transistor has been represented at each of the locations 200, 202N and 202P, but several transistors may be formed at each of these locations, for example by forming several parallel gates. The peripheral portions 210 correspond to the sites where the gate insulator has a thickening. The positions of the openings 204P and 204N of the step of FIG. 2A have been represented dashed. By way of example, viewed from above, the opening 204N has a rectangular shape which passes through the locations of the drain-source regions 136N.

As indicated previously, the channel region of the N-channel transistor 235N may have a weaker doping on its periphery in contact with the trenches 124 than at its centre, in particular when the dopant atoms are boron and when the insulator of the trenches is silicon oxide. These more weakly doped peripheral regions are indicated by the reference 240 in FIG. 2D. It follows from this that the threshold voltage of the transistor tends to be lower in these peripheral regions than in the central regions. This tendency is compensated in part or in full by the fact that the gate insulator 220 is thicker above the regions 240 than in the central regions, since the threshold voltage increases as the thickness of the gate insulator increases. Moreover, the properties of the regions 240 are not generally identical in transistors designed to be identical, and this results in differences between the threshold voltages of the peripheral regions of the various transistors. A thicker gate insulator at the edges of the transistors than at the centre of the transistors makes it possible for these differences to be compensated at least in part.

The width and the thickness of the peripheral portions 210 are chosen so as to obtain optimal electrical characteristics for the N-channel transistor. This is achieved by adjusting the parameters of the method, in particular, in the step of FIG. 2A, the difference between the width of the N-channel transistor and that of the opening 204N of the masking layer 110. By way of example, the width of the portions 210 is between 10 and 200 nm. By way of example, the semiconductor layer 104 of the SOI structure has a thickness of between 5 and 500 nm. The insulating layer 102 has a thickness of between 5 and 500 nm.

Moreover, the thickness of the gate insulator 130 of the P-channel transistor 235P and of the central part of the gate insulator 220 of the N-channel transistor 235N is chosen as a function of the properties desired for these transistors. Accordingly, preferably, a thickness of the semiconductor layer 104 of the SOI structure which is less than the desired thickness of the central part of the gate insulator 220 is chosen in the step of FIG. 2A.

According to one advantage, transistors of SOI type, and N-channel and P-channel transistors of on-bulk-substrate type, are obtained simultaneously in a simple manner and in a particularly reduced number of steps.

According to another advantage, the N-channel transistor on bulk substrate obtained exhibits particularly low leakage currents, even for small transistors. This results in particularly low energy consumption, in particular for a chip comprising such transistors.

According to another advantage, when the method of FIGS. 2A to 2D is used to produce, in addition to the P-channel transistor on bulk substrate and the SOI transistor, several N-channel transistors designed to be identical, then N-channel transistors on bulk substrate are obtained whose electrical characteristics are quasi-identical, including during cold operation. Therefore, this method exhibits particular interest in respect of the production of transistors intended to be used in a measurement device. Furthermore, this results in particularly high fabrication efficiency.

Figure 3:
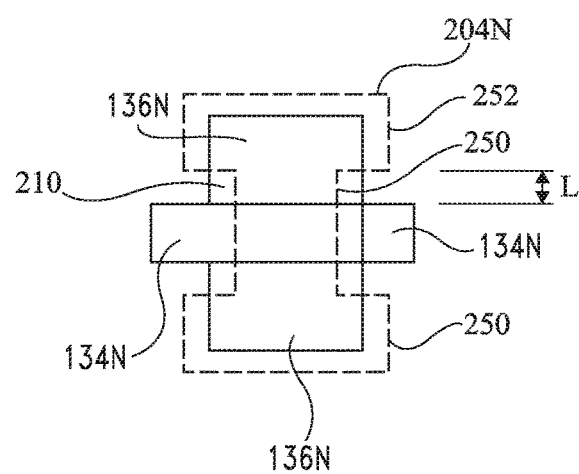
FIG. 3 is a schematic view from above of an N-channel transistor of on-bulk-substrate type, illustrating a variant of the method of FIGS. 2A to 2D.

FIG. 3 is a schematic view from above of an N-channel transistor obtained by implementing a variant of the method of FIGS. 2A to 2D.

In the variant of FIG. 3, the opening 204N is not rectangular when viewed from above. The opening 204N of the step of FIG. 2A has a central part 250 which is less wide than the future N-channel transistor, and two parts 252 which are wider than the future N-channel transistor. The two parts 252 are situated, when viewed from above, at the location of the drain and source regions. The central part 250 is situated, when viewed from above, at the location of the gate and is prolonged on each side of the location of the gate over a length L of for example between 1 and 100 nm.

On account of the presence of the parts 252, the formation of the drain-source regions 136, as well as of contacts (not represented) on the drain-source regions, is facilitated. The fact that the central parts 250 are prolonged on each side of the location of the gate makes it possible to ensure that the peripheral regions 210 are correctly positioned under the gate, even if the opening 204N is not perfectly positioned with respect to the location 202N of the transistor.

Particular embodiments have been described. Diverse variants and modifications will be apparent to the person skilled in the art. In particular, in the step of FIG. 2E, the portions 212 of the semiconductor layer 104 and the part 218 of the substrate have been oxidized, plumb with the gate of the N-channel transistor 235N, so as to form the gate insulator 220. In one variant, the portions 212 and/or some of part 218 of the substrate, and optionally an upper part of the portions 210 is/are removed, and then the gate insulator is formed by deposition. In another variant, before the oxidation step, a part of the portions 212 and/or of the part 218 of the substrate is/are removed, and the gate insulator 220 is formed thereafter by an oxidation followed by an optional deposition. In another variant, after formation of the gate insulator by oxidation, an upper part of the gate insulator 220 is removed before forming the gate 134.

Furthermore, although the transistors on bulk substrate obtained by the method of FIGS. 2A to 2D are a P-channel transistor and an N-channel transistor, it is possible to obtain in place of the P- and N-channel transistors, respectively first and second transistors each P- or N-channel. The advantages described hereinabove for the N-channel transistor are retained for the second transistor, in particular when the second transistor exhibits diverse edge effects.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   making a silicon on insulator (SOI) transistor, a first bulk substrate transistor, and a second bulk substrate transistor, the making including:
   forming a masking layer covering a silicon on insulator (SOI) transistor region of a semiconductor layer on an insulating layer covering a semiconductor substrate, the masking layer including a first opening and a second opening which is less wide than the first opening;
   plumb with the first and second openings, etching first and second cavities, respectively, which pass entirely through the semiconductor layer and insulating layer, resulting in remaining portions of the insulating layer and semiconductor layer between the cavities;
   growing the semiconductor substrate by epitaxy in the cavities as far as an upper level of the semiconductor layer;
   forming first, second, and third trenches in the substrate, the first trench isolating the SOI transistor region from a first bulk substrate transistor region and the second trench isolating the first bulk substrate transistor region from a second bulk substrate transistor region, wherein forming the first, second, and third trenches leaves remaining portions of the semiconductor layer and insulating layer in the second bulk substrate transistor region between the second and third trenches; and
   forming gate insulators of the SOI transistor, first bulk substrate transistor, and second bulk substrate transistor, respectively, the gate insulator of the second bulk substrate transistor comprising the remaining portions of the insulating layer in the second bulk substrate transistor region and being thicker at edges than at a center of the second bulk substrate transistor.

2. The method according to claim 1, wherein forming the gate insulator of the second bulk substrate transistor includes undertaking a thermal oxidation of the remaining portions of the semiconductor layer that are situated on the remaining portions of the insulating layer.

3. The method according to claim 1, wherein forming the gate insulator of the second bulk substrate transistor includes removing at least one upper part of the remaining portions of the semiconductor layer that are situated on the remaining portions of the insulating layer.

4. The method according to claim 1, wherein forming the gate insulator of the second bulk substrate transistor includes forming the gate insulator of the second bulk substrate transistor at least in part by deposition.

5. The method according to claim 1, comprising:
   covering the semiconductor layer with a silicon nitride layer prior to forming the masking layer on the SOI region;
   etching the silicon nitride layer plumb with the openings prior to etching the first and second cavities through the semiconductor layer and insulating layer; and removing the masking layer after etching the first and second cavities through the semiconductor layer and insulating layer and prior to growing the semiconductor substrate by epitaxy.

6. The method according to claim 1, comprising covering the semiconductor layer with a silicon oxide layer prior to forming the masking layer on the SOI region.

7. The method according to claim 1, in which forming the second opening includes forming the second opening to have a rectangular shape viewed from above, the method further comprising forming drain and source regions of the second bulk substrate transistor in the second bulk substrate transistor region.

8. The method according to claim 1, in which forming the second opening includes forming the second opening to have, viewed from above, a central part and two end portions the are wider than the central part, the method further comprising forming drain and source regions of the second bulk substrate transistor in portions of the second bulk substrate transistor region that were below the end portions, the drain and source regions being wider than the central part of the second opening and narrower than the end portions of the second opening.

9. The method according to claim 1, in which the said remaining portions of the insulating layer have a width of between 2 and 50 nm.

10. The method according to claim 1, in which the first bulk substrate transistor is a P-channel transistor and the second bulk substrate transistor is an N-channel transistor.

11. An electronic chip comprising:
a silicon on insulator (SOI) transistor formed at least partially in a semiconductor layer formed on an insulating layer that is formed on a semiconductor substrate;
a first bulk substrate transistor formed at least partially in the semiconductor substrate; and
a second bulk substrate transistor formed at least partially in the semiconductor substrate, the second bulk substrate transistor including a gate insulator with edges that comprise portions of the insulating layer, the gate insulator of the second bulk substrate transistor being thicker at the edges than at a center of the gate insulator of the second bulk substrate transistor, wherein the first bulk substrate transistor has a gate insulator that does not include any of the insulating layer.

12. The electronic chip according to claim 11, in which the first bulk substrate transistor is a P-channel transistor and the second bulk substrate transistor is an N-channel transistor.

13. The electronic chip according to claim 11, wherein the gate insulator of the second bulk substrate transistor includes a dielectric layer positioned on the semiconductor substrate.

14. The electronic chip according to claim 13, in which the portions of the insulating layer comprised in the edges include top surfaces that are above a bottom surface of the dielectric layer and bottom surfaces that are below the bottom surface of the dielectric layer.

15. A method, comprising:
forming a silicon on insulator (SOI) transistor at least partially in a semiconductor layer formed on an insulating layer that is formed on a semiconductor substrate;
forming a first bulk substrate transistor at least partially in the semiconductor substrate; and
forming a second bulk substrate transistor at least partially in the semiconductor substrate, the second bulk substrate transistor including a gate insulator with edges that comprise portions of the insulating layer, the gate insulator of the second bulk substrate transistor being thicker at the edges than at a center of the gate insulator of the second bulk substrate transistor, wherein forming the first bulk substrate transistor includes forming a gate insulator that does not include any portions of the insulating layer.

16. The method according to claim 15, wherein:
forming the SOI transistor and the first and second bulk substrate transistors includes etching first and second cavities that pass entirely through the semiconductor layer and the insulating layer, the etching leaving first remaining portions of the insulating layer and semiconductor layer in an SOI transistor region and second remaining portions of the insulating layer and semiconductor layer on opposite sides of the second cavity;
forming the first and second bulk substrate transistors includes growing the semiconductor substrate by epitaxy in the first and second cavities; and
forming the SOI transistor and the first and second bulk substrate transistors includes forming first, second, and third trenches in the substrate, the first trench isolating the SOI transistor region from a first bulk substrate transistor region and the second trench isolating the first bulk substrate transistor region from a second bulk substrate transistor region, wherein forming the first and second trenches leaves third remaining portions of the semiconductor layer and insulating layer in the second bulk substrate transistor region between the first and second trenches.

17. The method according to claim 16, wherein forming the gate insulator of the second bulk substrate transistor includes undertaking a thermal oxidation of the third remaining portions of the semiconductor layer.

18. The method according to claim 16, further comprising:
forming a masking layer covering the semiconductor layer and the insulating layer in the SOI transistor region, the masking layer including a first opening in the first bulk substrate transistor region and a second opening, which is less wide than the first opening, in the second bulk substrate transistor region, wherein etching first and second cavities includes etching first and second cavities plumb with the first and second openings, respectively, and forming the second opening includes forming the second opening to have a rectangular shape viewed from above; and
forming drain and source regions of the second bulk substrate transistor in the second bulk substrate transistor region.

19. The method according to claim 16, further comprising:
forming a masking layer covering the semiconductor layer and the insulating layer in the SOI transistor region, the masking layer including a first opening in the first bulk substrate transistor region and a second opening, which is less wide than the first opening, in the second bulk substrate transistor region, wherein etching first and second cavities includes etching first and second cavities plumb with the first and second openings, respectively, and forming the second opening includes forming the second opening to have, viewed from above, a central part and two end portions the are wider than the central part; and
forming drain and source regions of the second bulk substrate transistor in portions of the second bulk substrate transistor region that were below the end portions, the drain and source regions being wider than the central part of the second opening and narrower than the end portions of the second opening.

20. The method according to claim 15, in which the first bulk substrate transistor is a P-channel transistor and the second bulk substrate transistor is an N-channel transistor.

* * * * *

UNITED STATES PATENT AND TRADEMARK OFFICE
CERTIFICATE OF CORRECTION

| | | |
|---|---|---|
| PATENT NO. | : 10,777,552 B2 | Page 1 of 1 |
| APPLICATION NO. | : 16/046683 | |
| DATED | : September 15, 2020 | |
| INVENTOR(S) | : Franck Julien | |

It is certified that error appears in the above-identified patent and that said Letters Patent is hereby corrected as shown below:

In the Claims

<u>Column 9, Line 17, Claim 8:</u>
"the are wider" should read, --that are wider--.

<u>Column 10, Line 63, Claim 19:</u>
"end portions the" should read, --end portions that--.

Signed and Sealed this
Tenth Day of November, 2020

Andrei Iancu
*Director of the United States Patent and Trademark Office*